US010883172B2

(12) United States Patent
 Ohashi

(10) Patent No.: US 10,883,172 B2
(45) Date of Patent: Jan. 5, 2021

(54) METHOD OF MANUFACTURING LITHOGRAPHY TEMPLATE

(71) Applicant: Hitachi Kokusai Electric Inc., Tokyo (JP)

(72) Inventor: Naofumi Ohashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 340 days.

(21) Appl. No.: 15/885,378

(22) Filed: Jan. 31, 2018

(65) Prior Publication Data
 US 2018/0216226 A1    Aug. 2, 2018

(30) Foreign Application Priority Data

Feb. 2, 2017   (JP) .................................. 2017-017534

(51) Int. Cl.
  *C23C 16/04*   (2006.01)
  *C23C 16/458*   (2006.01)
  (Continued)

(52) U.S. Cl.
  CPC .......... *C23C 16/4408* (2013.01); *C23C 16/04* (2013.01); *C23C 16/34* (2013.01);
  (Continued)

(58) Field of Classification Search
  CPC ...... C23C 16/04; C23C 16/4586; C23C 16/46
  (Continued)

(56) References Cited

U.S. PATENT DOCUMENTS

| 6,354,832 | B1 * | 3/2002 | Yoshimura | ........ H01L 21/67109 |
| | | | | 118/725 |
| 2002/0117471 | A1 * | 8/2002 | Hwang | ................... C23C 16/46 |
| | | | | 216/55 |

(Continued)

FOREIGN PATENT DOCUMENTS

| JP | 2000-034568 A | 2/2000 |
| JP | 2013-235885 A | 11/2013 |

(Continued)

OTHER PUBLICATIONS

Office Action in corresponding Korean Patent Application No. 10-2018-0009174, prepared on Jan. 25, 2018, with English translation.

*Primary Examiner* — Elizabeth A Burkhart
(74) *Attorney, Agent, or Firm* — Edell, Shapiro & Finnan, LLC

(57) ABSTRACT

Described herein is a technique capable of improving the quality of a template. According to the technique described herein, there is provided a method of manufacturing a lithography template, including: (a) loading a substrate into a process chamber, the substrate having a pattern region and a non-contacting region at center and peripheral portions thereof, respectively; (b) placing the substrate on a substrate support having a protruding portion and a bottom portion such that a back surface of the non-contacting region of the substrate is supported by the protruding portion; (c) heating the substrate by supplying a first hot gas into a space defined by the protruding portion and the bottom portion while supplying a second hot gas into the process chamber; and (d) processing the substrate after performing (c) by supplying a process gas into the process chamber while supplying the first hot gas into the space.

20 Claims, 10 Drawing Sheets

(51) Int. Cl.
   *C23C 16/46* (2006.01)
   *C23C 16/44* (2006.01)
   *C23C 16/34* (2006.01)
   *C23C 16/513* (2006.01)
   *H01L 21/033* (2006.01)
   *G03F 7/00* (2006.01)
   *G03F 7/16* (2006.01)
   *C23C 16/455* (2006.01)

(52) U.S. Cl.
   CPC .... *C23C 16/4586* (2013.01); *C23C 16/45536* (2013.01); *C23C 16/46* (2013.01); *C23C 16/513* (2013.01); *G03F 7/0002* (2013.01); *G03F 7/167* (2013.01); *H01L 21/0332* (2013.01); *H01L 21/0335* (2013.01); *H01L 21/0337* (2013.01)

(58) Field of Classification Search
   USPC .................................................. 118/725, 728
   See application file for complete search history.

(56) References Cited

U.S. PATENT DOCUMENTS

2006/0213439 A1* 9/2006 Ishizaka .............. C23C 16/4401
                                                                    118/715
2011/0146568 A1* 6/2011 Haukka ............. C23C 16/45555
                                                                    118/200
2016/0079101 A1   3/2016 Yanai et al.

FOREIGN PATENT DOCUMENTS

JP          2016-63033 A      4/2016
KR       1019970052428 A      7/1997

* cited by examiner

US 10,883,172 B2

METHOD OF MANUFACTURING LITHOGRAPHY TEMPLATE

CROSS REFERENCE TO RELATED APPLICATIONS

This application claims foreign priority under 35 U.S.C. § 119(a)-(d) to Japanese Patent Application No. 2017-017534, filed on Feb. 2, 2017, the entire contents of which are hereby incorporated by reference.

TECHNICAL FIELD

The present disclosure relates to a method of manufacturing a lithography template.

BACKGROUND

An exemplary substrate processing apparatus for processing a substrate includes a substrate support for supporting the substrate in the process chamber.

The substrate processing apparatus is capable of processing various types of substrates. One of the various types of substrates is a glass substrate used as a lithography template for nanoimprint. The lithography template is transcribed onto a resin on a substrate to form a pattern on the substrate.

In order to transcribe the lithography template onto the substrate through the nanoimprint process, the lithography template should have high accuracy. In order to produce a lithography template with high accuracy, a substrate processing such as a formation of a hard mask on the lithography template is necessary. When the hard mask is formed, for example, a process such as heating of the substrate is performed.

In the field of nanoimprint technology, the properties of structures (films) formed on a lithography template such as a glass substrate are influenced, for example, by the properties of the glass substrate. Therefore, when the lithography template is transcribed onto a substrate to form the pattern on the substrate, the characteristics of the semiconductor device formed on the substrate is affected by the lithography template.

SUMMARY

Described herein is a technique capable of improving the quality of a template.

According to one aspect of the technique described herein, there is provided a method of manufacturing a lithography template, including: (a) loading a substrate into a process chamber, the substrate having a pattern region and a non-contacting region at center and peripheral portions thereof, respectively; (b) placing the substrate on a substrate support having a protruding portion and a bottom portion such that a back surface of the non-contacting region of the substrate is supported by the protruding portion; (c) heating the substrate by supplying a first hot gas into a space defined by the protruding portion and the bottom portion while supplying a second hot gas into the process chamber; and (d) processing the substrate after performing (c) by supplying a process gas into the process chamber while supplying the first hot gas into the space.

DETAILED DESCRIPTION

Hereinafter, embodiments will be described with reference to the FIGS. 1A through 10.

First Embodiment

A first embodiment will be described.

Hereinafter, the first embodiment will be described with reference to the FIGS. 1A through 10.

Substrate Processing Apparatus

Figure 1A:
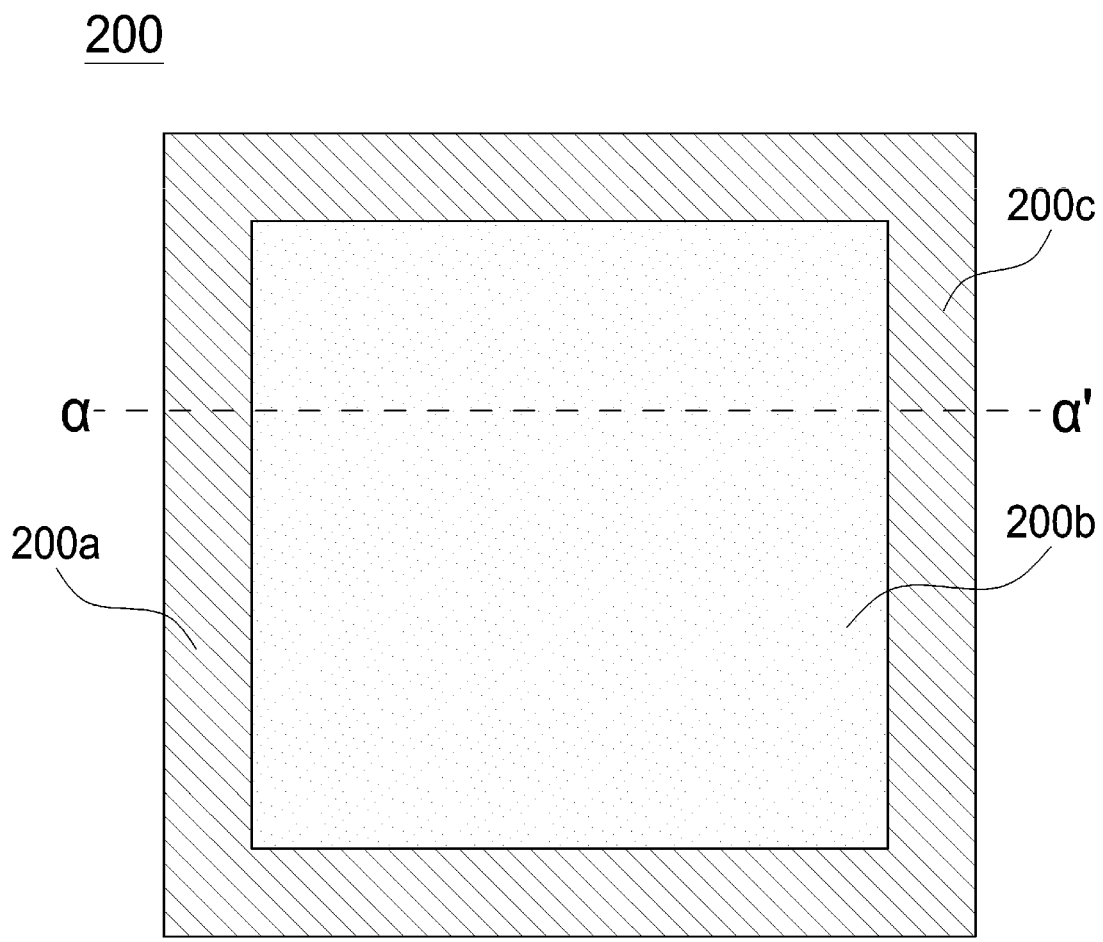
FIGS. 1A and 1B schematically illustrate a substrate to be processed by a substrate processing apparatus according to a first embodiment described herein.
Figure 1B:
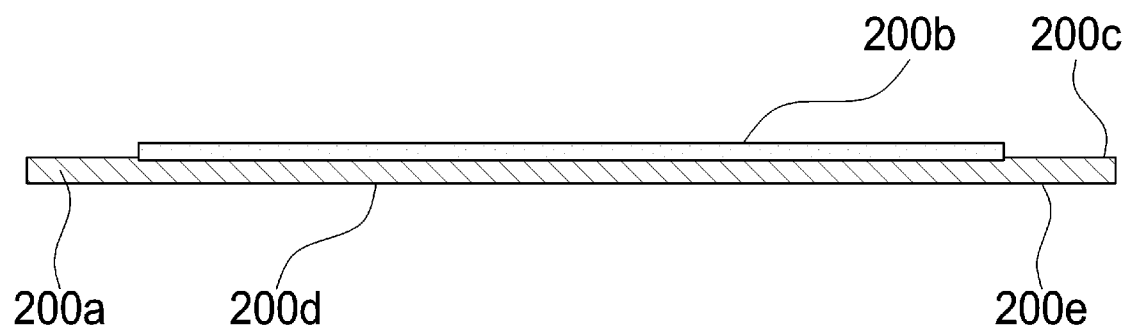

First, a substrate 200 to be processed will be described with reference to FIGS. 1A and 1B. FIG. 1A is a plan view of the substrate 200, and FIG. 1B is a cross-sectional view taken along the line α-α' of FIG. 1A. The substrate 200 is used as a lithography template for nanoimprint. Hereinafter, the lithography template for nanoimprint is also referred to as "L-template". A pre-formed template called the master template (not shown) is used to form the L-template. The L-template is used as a template for transcribing a pattern onto a substrate. By pressing the L-template onto the substrate, the pattern is transferred onto the substrate.

As described above, the substrate 200 is used as the L-template. The substrate 200 includes a base substrate 200a as a base and a pattern region 200b formed on the center portion of base substrate 200a. The pattern from the master template is transcribed onto the pattern region 200b. The pattern region 200b is convex such that the substrate 200 (L-template) is not in contact with a portion other than the portion of the substrate onto which the pattern is transcribed when the substrate (L-template) 200 is pressed onto the substrate. Structures such as a hard mask, which will be described later, are transcribed onto the pattern region 200b. The base substrate 200a and the pattern region 200b are made of a translucent material such as glass and quartz.

A region 200c is a peripheral portion of the front surface of the base substrate 200a other than the pattern region 200b. Because the region 200c does not come in contact with the substrate onto which the pattern is transcribed, the region 200c is also referred to as "non-contacting region 200c" in the first embodiment. A back surface 200*d* is the back surface of the pattern region 200*b*. A back surface 200*e* is the back surface of the non-contacting region 200*c*. In the first embodiment, the back surface 200*d* is also referred to as the "central back surface 200*d*" of the substrate 200 and the back surface 200*e* is also referred to as the "peripheral back surface 200*e*" of the substrate 200.

Figure 2:
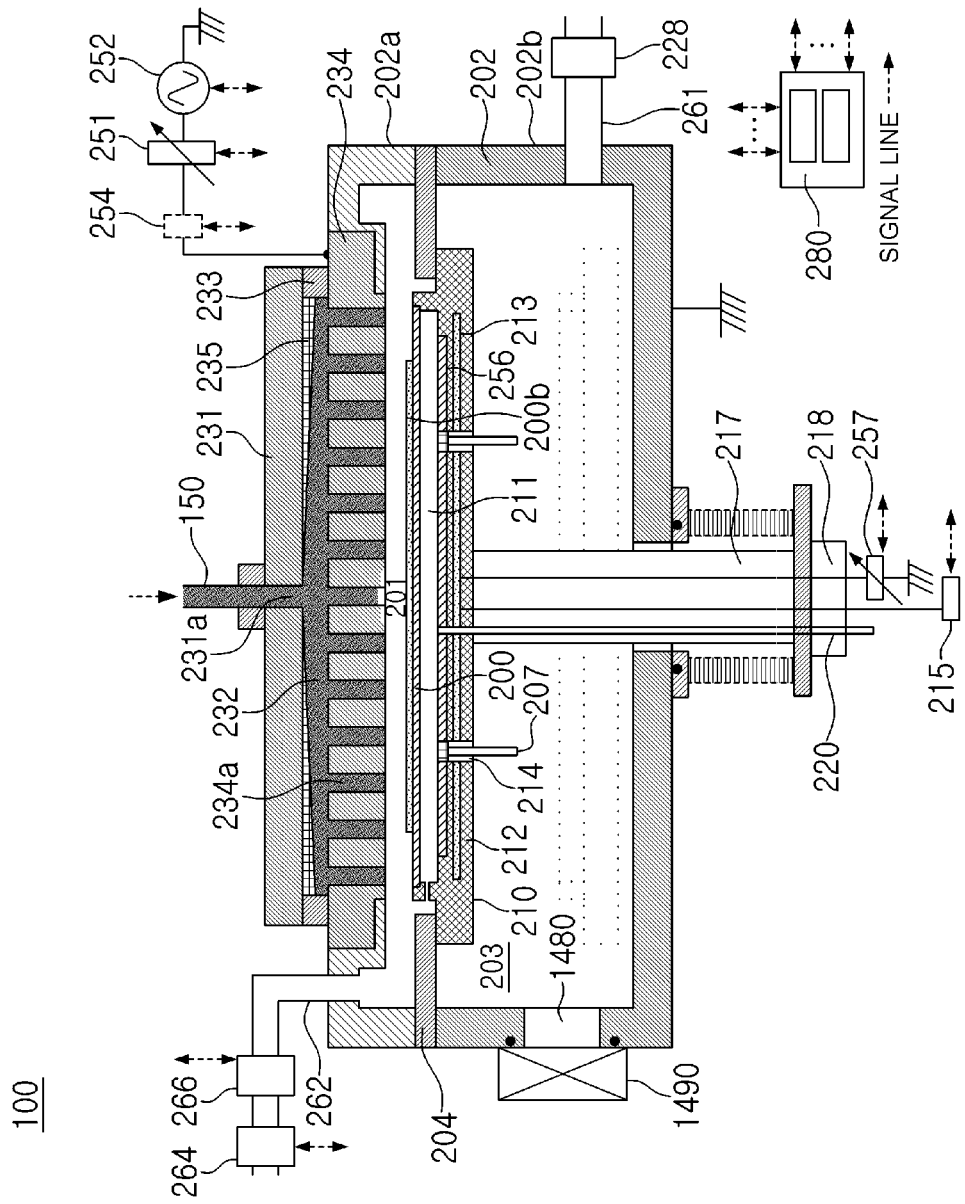
FIG. 2 schematically illustrates a vertical cross-section of the substrate processing apparatus according to the first embodiment.

Next, a substrate processing apparatus 100 for processing the substrate 200 shown in FIGS. 1A and 1B will be described with reference to the FIG. 2. FIG. 2 schematically illustrates a vertical cross-section of the substrate processing apparatus 100 according to the first embodiment.

Vessel

As shown in FIG. 2, the substrate processing apparatus 100 includes a vessel 202. A process chamber 201 where the substrate 200 is processed and a transfer chamber 203 where the substrate 200 passes through when the substrate 200 is transferred into the process chamber 201 are provided in the vessel 202. The vessel 202 includes an upper vessel 202*a* and a lower vessel 202*b*. A partition plate 204 is provided between the upper vessel 202*a* and the lower vessel 202*b*.

A substrate loading/unloading port 1480 is provided on a side surface of the lower vessel 202*b* adjacent to a gate valve 1490. The substrate 200 is moved between a transfer module (not shown) and the transfer chamber 203 through the substrate loading/unloading port 1480. The lower vessel 202*b* is electrically grounded.

A substrate support unit 210 is provided in the process chamber 201 to support the substrate 200. The substrate support unit 210 includes a substrate support 212 having a buffer structure 211, on which the substrate 200 is placed. Preferably, the substrate support unit 210 further includes a heater 213, which is a heating source, provided in the substrate support 212. The substrate support 212 is provided with through-holes 214 which are penetrated by lift pins 207. The upper portions of the lift pins 207 are inserted in the through-holes 214 and the lower portion of the lift pins 207 suspends from the through-holes 214. When the lower portion of the lift pins 207 suspends from the through-holes 214, the lift pins 207 blocks the gas in the buffer structure 211 from entering the transfer chamber 206 through the through-holes 214. A temperature control unit (temperature controller) 215 is electrically connected to the heater 213. The temperature control unit 215 is configured to control a temperature of the heater 213 in accordance with an instruction from a controller 280. The buffer structure 211 is defined by a protruding portion 211*a* and a bottom portion 211*e*. A space surrounded by the protruding portion 211*a* is referred to as a space 211*b*. The space 211*b* is also referred to as "buffer space." The substrate support 212 will be described later in detail. An electrode 256 may be also provided in the substrate support 212. A bias control unit (bias controller) 257 is electrically connected to the electrode 256. The bias control unit 257 is configured to control an electric potential of the substrate 200 in accordance with an instruction from the controller 280. An area of the electrode 256 is such that the electrode 256 covers an entirety of the pattern region 200*b* to uniformly supply active species to the pattern region 200*b*.

The substrate support 212 is supported by a shaft 217. The shaft 217 penetrates the bottom of the vessel 202 and is coupled to an elevating mechanism 218 at the outside of the vessel 202. A hot gas supply pipe 220, which will be described later, is provided inside the shaft 217. In the first embodiment, the substrate support 212 is also referred to as the substrate support unit. The substrate support 212 will be described later in detail.

A shower head, which is a gas dispersion mechanism, is provided in the upper portion (at the upstream side) of the process chamber 201. The shower head at least includes a cover 231, a rectifier 235 and a dispersion plate 234. A gas introduction port 231*a* is provided at the cover 231. The gas introduction port 231*a* communicates with a common gas supply pipe 150 which will be described later.

The shower head includes the dispersion plate 234 to disperse gases. The upstream side of the dispersion plate 234 is referred to as a buffer space 232 of the shower head. The downstream side of the dispersion plate 234 is referred to as the process chamber 201. Through-holes 234*a* are provided at the dispersion plate 234.

The rectifier 235 is provided at the upstream side of the dispersion plate 234 under the gas introduction port 231*a*. The rectifier 235 is configured to guide the gases supplied through the gas introduction port 231*a* toward the peripheral portion of the dispersion plate 234.

The cover 231 is fixed to the upper surface of the dispersion plate 234 through a support block 233.

The dispersion plate 234 also serves as an electrode (activation unit) by supplying high frequency power thereto. The gas supplied to the process chamber 201 through the dispersion plate 234 is activated (into plasma state) when high-frequency power is supplied.

Activation Unit (Plasma Generator)

A matching unit 251 and a high frequency power supply 252 are connected to the electrode serving as the activation unit through a switch 254 and are configured to supply electromagnetic waves (high frequency power or microwave). The gas supplied into the process chamber 201 through the dispersion plate 234 may be activated into plasma by the electromagnetic waves. The switch 254, the matching unit 251 and the high frequency power supply 252 are electrically connected to the controller 280 through signal lines and controlled by the controller 280. Plasma enables the processing of the pattern region 200*b* at a temperature lower than the temperature at which the substrate 200 is softened.

Substrate Support

Figure 3:
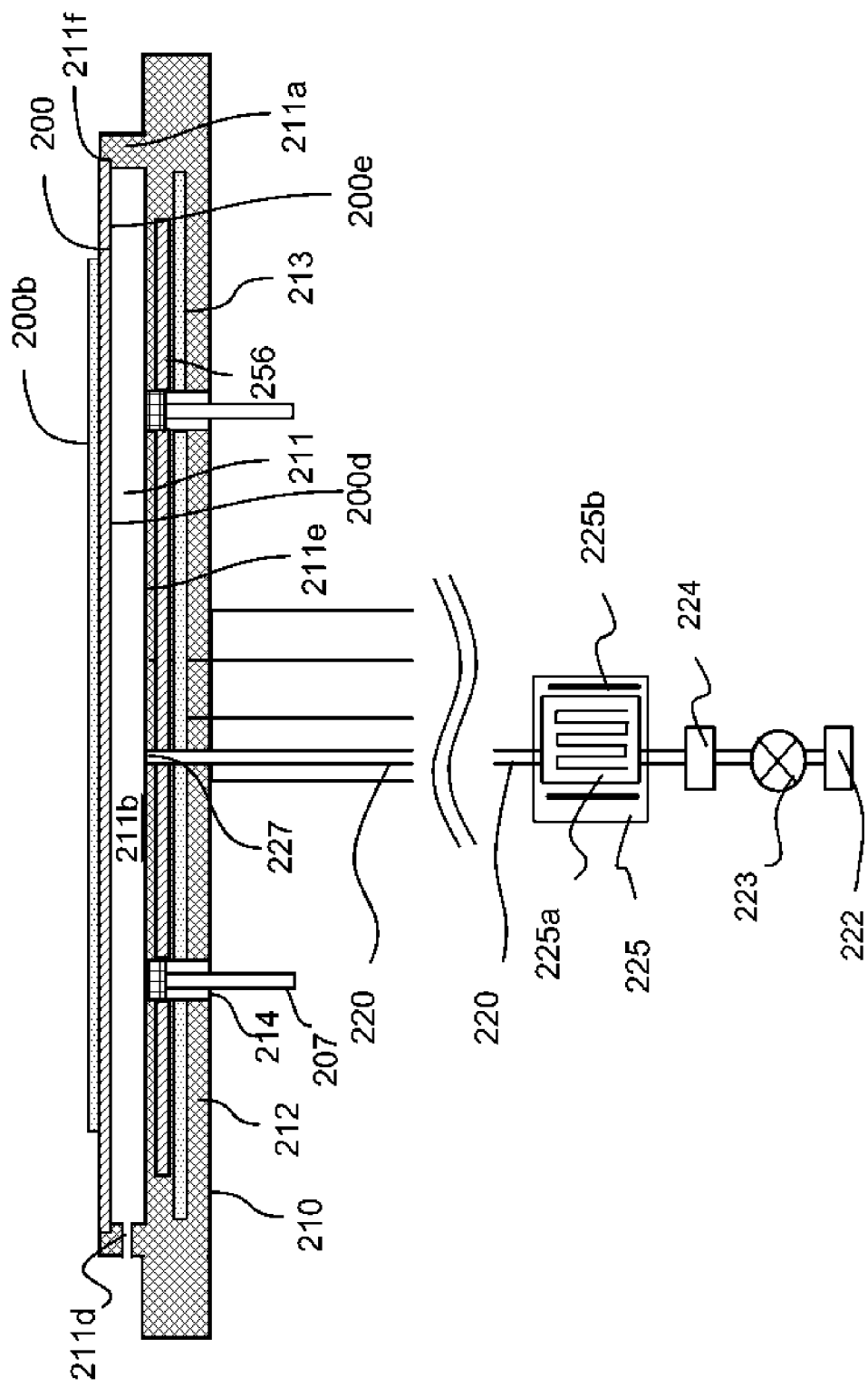
FIG. 3 schematically illustrates a vertical cross-section of a substrate support of the substrate processing apparatus according to the first embodiment.

Next, the structure of the substrate support will be described in detail with reference to FIG. 3. FIG. 3 is an enlarged view of the substrate support 212. As described above, the buffer structure 211 includes the protruding portion 211*a*. The protruding portion 211*a* supports the peripheral back surface 200*e* of the substrate 200 and is, for example, annular. The space 211*b* is defined by the back surface of the substrate 200 supported by the upper end of the protruding portion 211*a*, the inner surface of the protruding portion 211*a* and the surface of the bottom portion 211*e* of the buffer structure 211.

The contact area between the back surface of the substrate 200 and the substrate support 212 is reduced by the space 211*b* when the substrate 200 is supported by the protruding portion 211*a*. Therefore, generation of particles due to contact may be suppressed.

The size of the protruding portion 211*a* is such that the space 211*b* is provided about the central back surface 200*d* of the pattern region 200*b* and the peripheral back surface 200*e* of the non-contacting region 200*c* is supported. That is, there is no structure supporting the central back surface 200*d* of the substrate 200.

Holes 211*d* provided in a portion of the protruding portion 211*a* are open toward the side surface. The holes 211*d* penetrate the protruding portion 211*a* and are provided at a predetermined interval. The space 211*b* is spatially in communication with the space outside the protruding portion 211a, that is, the process chamber 201 through the holes 211d.

A stepped member 211f capable of supporting the edge portion of the substrate 200 is provided at the inner side of the upper end of the protruding portion 211a. The height of the stepped member 211f is about the thickness of the substrate 200. The stepped member 211f of the protruding portion 211a suppresses the generation of the turbulence of the process gas in the vicinity of the edge portion of the substrate 200. As a result, the uniformity of substrate processing is improved. Moreover, since the stepped member 211f improves airtightness of the space 211b, hot gas, which will be described later, is prevented from flowing into the process chamber 201 through the gap between the protruding portion 211a and the substrate 200. The flow of the hot gas into the process chamber 201 through the gap between the protruding portion 211a and the substrate 200 may have adverse affect on the processing performed in the film-forming process S301 described below.

A hot gas supply port 227 is provided at the bottom portion 211e. The hot gas supply port 227 is provided at one end of the hot gas supply pipe 220. A hot gas source 222 is connected to the other end of the hot gas supply pipe 220. The gas supplied from the hot gas source 222 may be an inert gas. The inert gas is heated by a gas heating unit 225, which will be described later. Hereinafter, the heated inert gas may be also referred to as "hot gas."

A valve 223, a mass flow controller (MFC) 224 and the gas heating unit 225 are installed at the hot gas supply pipe 220 in order from the upstream side to the downstream side of the hot gas supply pipe 220 between the hot gas source 222 and the hot gas supply port 227. The valve 223 and the mass flow controller (MFC) 224 adjust a flow rate of the inert gas supplied from the hot gas source 222. The gas heating unit 225 heats the inert gas supplied from the hot gas source 222. For example, the gas heating unit 225 at least includes a labyrinth structure 225a and a resistance heating element 225b disposed in the peripheral portion of the labyrinth structure 225a. The inert gas passing through the gas heating unit 225 is heated by the resistance heating element 225b while passing through the labyrinth structure 225a. As a result, the inert gas is heated to a desired temperature.

The inert gas is supplied to the space 211b via the valve 223, the mass flow controller 224 and the gas heating unit 225. The first hot gas supplied to the space 211b heats the back surfaces 200d and 200e of the substrate 200 by the convection and then exhausted through the holes 211d. In the first embodiment, the gas heating unit 225, the mass flow controller 224 and the valve 233 are collectively referred to as a first hot gas supply system. The first hot gas supply system may further include the hot gas source 222.

Figure 10:
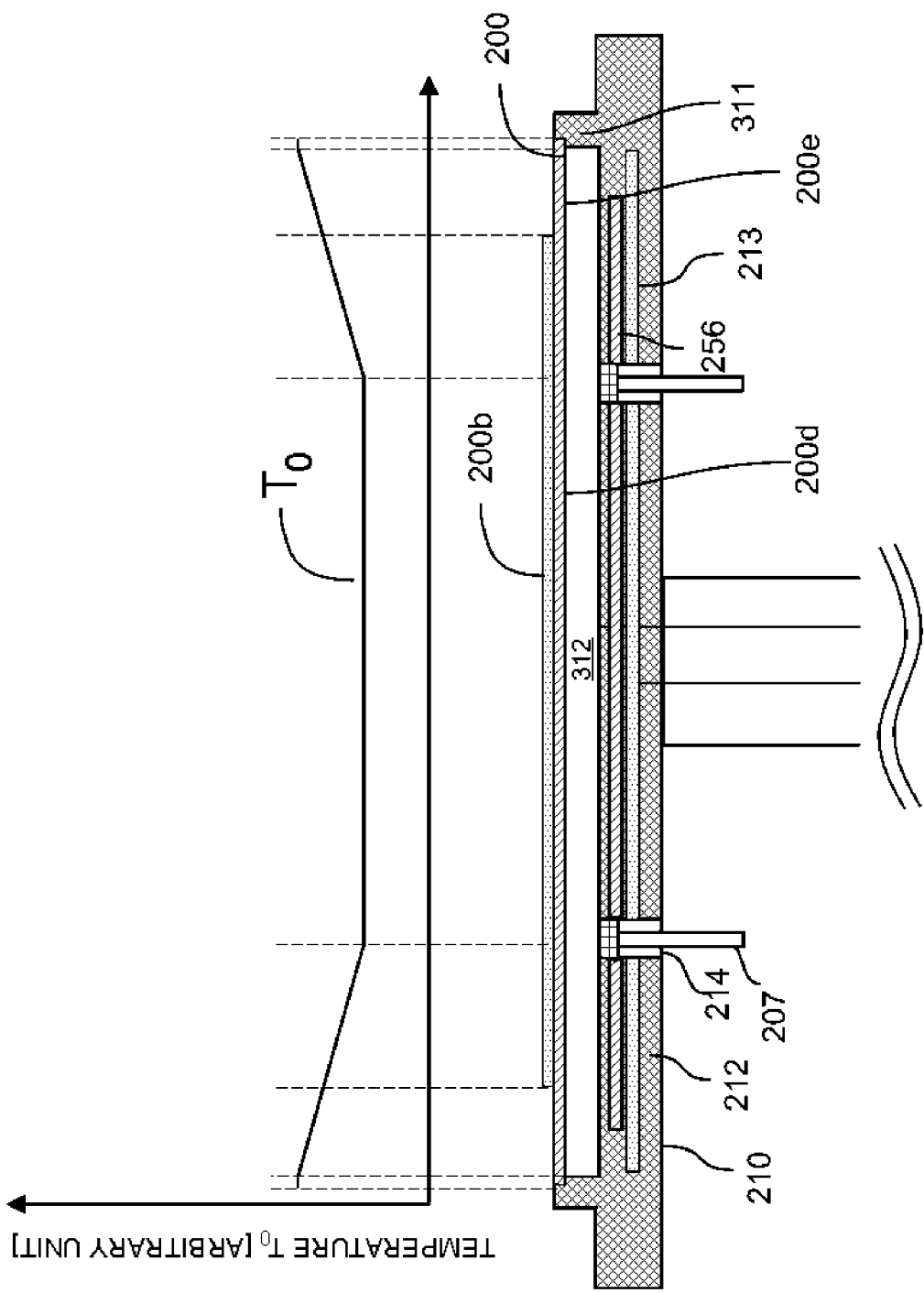
FIG. 10 illustrates a temperature distribution at a surface of a substrate placed on a substrate support of a substrate processing apparatus according to a comparative example.

The reason for heating the back surface 200e via the space 211b according to the first embodiment will be explained with reference to a comparative example. FIG. 10 illustrates the comparative example. As shown in FIG. 10, the structure according to the comparative example does not include the hot gas supply pipe 220 but only includes a protruding portion 311. T0 represents the temperature distribution at the surface of the substrate 200. As shown in FIG. 10, the peripheral portion (peripheral back surface 200e) of the substrate 200 is heated by the heat from the heater 213 conducted through the contact portion between the protruding portion 311 and the substrate 200. Since the center portion (central back surface 200d) of the substrate 200 is spaced apart from the protruding portion 311, the efficiency of heating the center portion of the substrate 200 by thermal conductivity is lower than that of heating the peripheral portion of the substrate 200 by the thermal conductivity. When the substrate 200 is processed, the process chamber 201 is in vacuum state. Therefore, the space 312 is also in vacuum state. As a result, convection does not occur in the space 312, and the temperature of the center portion of the substrate 200 is lower than that of the peripheral portion as in the temperature distribution T0. The same applies to the temperature distribution of the pattern region 200b. That is, the temperature of the center portion of the pattern region 200b is lower than that of the peripheral portion of the pattern region 200b. That is, a temperature difference exists in the substrate 200. The temperature difference may be overcome by increasing the time duration of heating the substrate 200. However, the increase in the time duration results in the degradation of manufacturing throughput.

Figure 4:
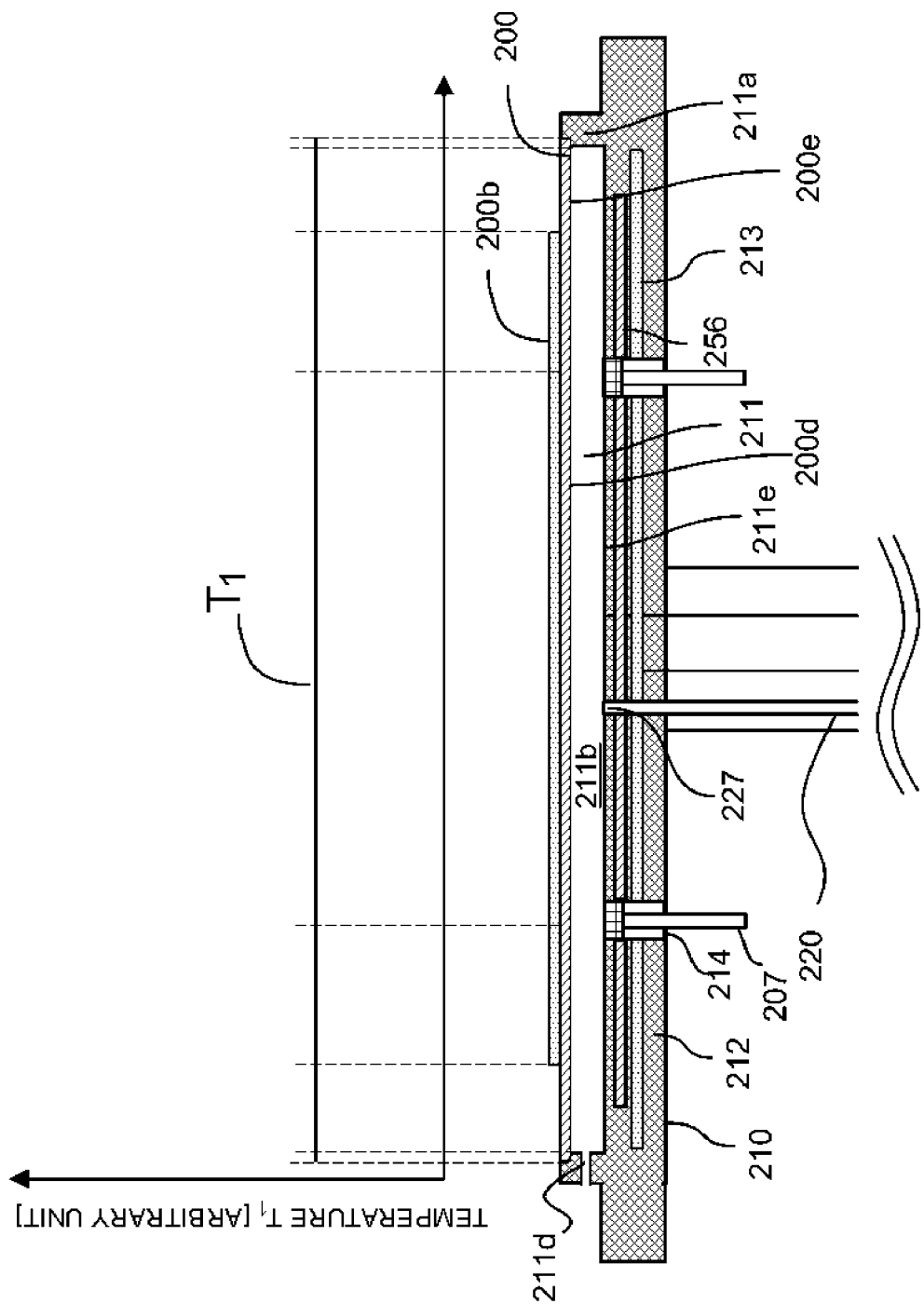
FIG. 4 illustrates a temperature distribution at a surface of the substrate placed on the substrate support of the substrate processing apparatus according to the first embodiment.

On the other hand, according to the first embodiment, as shown in FIG. 4, the first hot gas is supplied to the space 211b through the hot gas supply pipe 220. The central back surface 200d of the substrate 200 is heated by the convection of heat from the heater 213 and the thermal energy of the first hot gas since the space 211b is filled with the first hot gas. The temperature of the back surface 200e is maintained to be uniform by thermal conduction at the portion which comes in contact with the first hot gas. That is, the temperature distribution at the surface of the substrate 200 is substantially flat as in the temperature distribution T1 shown in FIG. 4, and the temperature distribution of the pattern region 200b is thereby also flat. Therefore, the thickness of the film formed in the pattern region 200b is uniform.

Since the space 211b is provided below the peripheral back surface 200e of the substrate 200, the first hot gas may heat the peripheral portion of the substrate 200. That is, the first hot gas may heat the non-contacting region 200c. Since the back surface 200e as well as the back surface 200d may be heated, the peripheral portion of the pattern region 200b may also be suitably heated. When only the central back surface 200d is heated, the temperature at the boundary between the pattern region 200b and the non-contacting region 200c is lower than the temperature of the center portion of the pattern region 200b. However, according to the first embodiment, the central back surface 200d as well as the peripheral back surface 200e of the substrate 200 may be heated.

Process Gas Supply System

Figure 5:
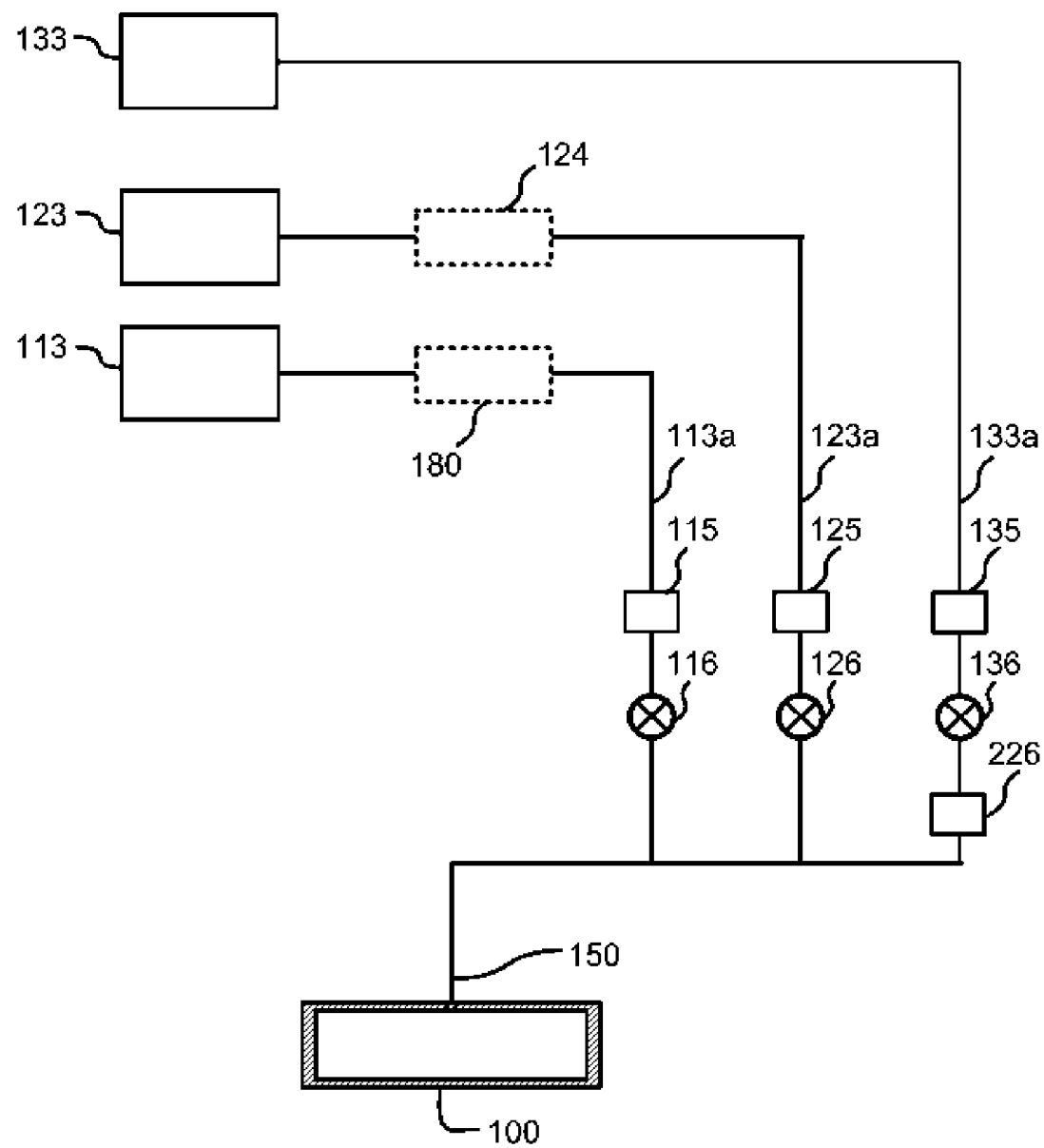
FIG. 5 schematically illustrates a configuration of a process gas supply system of the substrate processing apparatus according to the first embodiment.

The common gas supply pipe 150 is connected to the cover 231 to be spatially in communication with the gas introduction port 231a provided in the cover 231. As shown in FIG. 5, a first gas supply pipe 113a, a second gas supply pipe 123a and a third gas supply pipe 133a are connected to the common gas supply pipe 150. In the first embodiment, the gases supplied through the first gas supply pipe 113a, the second gas supply pipe 123a and the third gas supply pipe 133a are referred to as process gases.

First Gas Supply System

A first gas source 113, a mass flow controller (MFC) 115 serving as a flow rate controller (flow rate control unit) and a valve 116 serving as an opening/closing valve are installed at the first gas supply pipe 113a in order from the upstream side to the downstream side of the first gas supply pipe 113a.

The first gas source 113 is the source of a first gas containing a first element (also referred to as "first element-containing gas"). In the first embodiment, the first element includes, for example, titanium (Ti). That is, the first element-containing gas includes a titanium-containing gas such as $TiCl_4$ gas. The source of the first element-containing gas may be solid, liquid or gas at room temperature and under atmospheric pressure. When the source of the first element-containing gas is liquid at room temperature and under atmospheric pressure, an evaporator 180 may be provided between the first gas supply source 113 and the mass flow controller 115. In the first embodiment, the source of the first element-containing gas is in gaseous state.

The first gas supply system (also referred to as titanium-containing gas supply system) may include the first gas supply pipe 113a, the MFC 115 and the valve 116.

Second Gas Supply System

A second gas source 123, a mass flow controller (MFC) 125 serving as a flow rate controller (flow rate control unit), a valve 126 serving as an opening/closing valve and a remote plasma unit (RPU) 124 are installed at the second gas supply pipe 123a in order from the upstream side to the downstream side of the second gas supply pipe 123a.

A gas containing a second element (hereinafter referred to as "second element-containing gas") is supplied into the shower head via the mass flow controller 125, the valve 126 and the remote plasma unit 124 provided in the second gas supply pipe 123a. The second element-containing gas is supplied onto the substrate 200 in plasma state activated by the remote plasma unit 124.

The remote plasma unit 124, which is a plasma generator, generates plasma using, for example, an ICP (Inductive Coupling Plasma) method. The remote plasma unit 124 may include components such as a coil (not shown), matching box (not shown) and a power supply (not shown). As described in more detail later, the components of the remote plasma unit 124 such as the power supply and the matching box may be adjusted in advance based on conditions such as gas type and pressure range in order to generate plasma with low ions and high radicals when the second element-containing gas passes through the remote plasma unit 124.

The second element-containing gas is one of the process gases. In the first embodiment, the second element-containing gas may be a reactive gas or a modifying gas. Therefore, the second gas supply system may be also referred to as a reactive gas supply system. That is, the second gas may be referred to as reactive gas. For example, the second gas source 123 may be referred to as a reactive gas source.

In the first embodiment, the second element in the second element-containing gas is different from the first element. The second element may include, for example, any one of oxygen (O), nitrogen (N) and carbon (C). In the first embodiment, a nitrogen-containing gas such as ammonia ($NH_3$) gas may be used as the second element-containing gas.

The second gas supply system (also referred to as a nitrogen-containing gas supply system) may include the second gas supply pipe 123a, the mass flow controller 125 and the valve 126.

Third Gas Supply System

A third gas source 133, a mass flow controller (MFC) 135 serving as a flow rate controller (flow rate control unit) and a valve 136 serving as an opening/closing valve are installed at the third gas supply pipe 133a in order from the upstream side to the downstream side of the third gas supply pipe 133a.

The third gas source 133 is the source of the inert gas. The inert gas may be used to dilute the first gas or the second gas. The inert gas may be also used to purge the inner atmosphere of the process chamber. In the first embodiment, for example, nitrogen ($N_2$) gas is used as the third gas.

The third gas supply system may include the third gas supply pipe 133a, the mass flow controller 135 and the valve 136.

A second hot gas supply system 226 is provided between the third gas supply system and the common gas supply pipe 150 to generate a second hot gas by heating the third gas. The structure of the second hot gas supply system 226 is the same as that of the gas heating unit 225.

One of the first gas supply system and the second gas supply system, or both, are referred to as a process gas supply system. The process gas supply system may further include the third gas supply system.

Exhaust System

The exhaust system for exhausting the inner atmosphere of the vessel 202 includes a plurality of exhaust pipes connected to the vessel 202. That is, the exhaust system includes an exhaust pipe (first exhaust pipe) 262 connected to the process chamber 201 and an exhaust pipe (second exhaust pipe) 261 connected to the transfer chamber 203.

A pump (Turbo Molecular Pump) 264 is provided in the exhaust pipe 262.

The exhaust pipe 262 is connected to the side portion of the process chamber 201. An APC (Automatic Pressure Controller) 266, which is a pressure controller, is provided in the exhaust pipe 262 to adjust the inner pressure of the process chamber 201 to a predetermined pressure. The APC 266 includes an adjustable valve body (not shown). The APC 266 is configured to adjust the conductance of the exhaust pipe 262 in response to an instruction from the controller 280. The exhaust pipe 262 and the APC 266 are collectively referred to as a process chamber exhaust system.

The exhaust pipe 261 is connected to the side portion of the transfer chamber 203. An APC (Automatic Pressure Controller) 228, which is a pressure controller, is provided in the exhaust pipe 261 to adjust the inner pressure of the transfer chamber 203 to a predetermined pressure. The APC 228 includes an adjustable valve body (not shown). The APC 228 is configured to adjust the conductance of the exhaust pipe 261 in response to an instruction from the controller 280. The exhaust pipe 261 and the APC 228 are collectively referred to as a transfer chamber exhaust system.

Controller

Next, the controller 280 of the substrate processing apparatus 100 will be described in detail with reference to FIG. 6. The substrate processing apparatus 100 includes the controller 280 configured to control components thereof.

Figure 6:
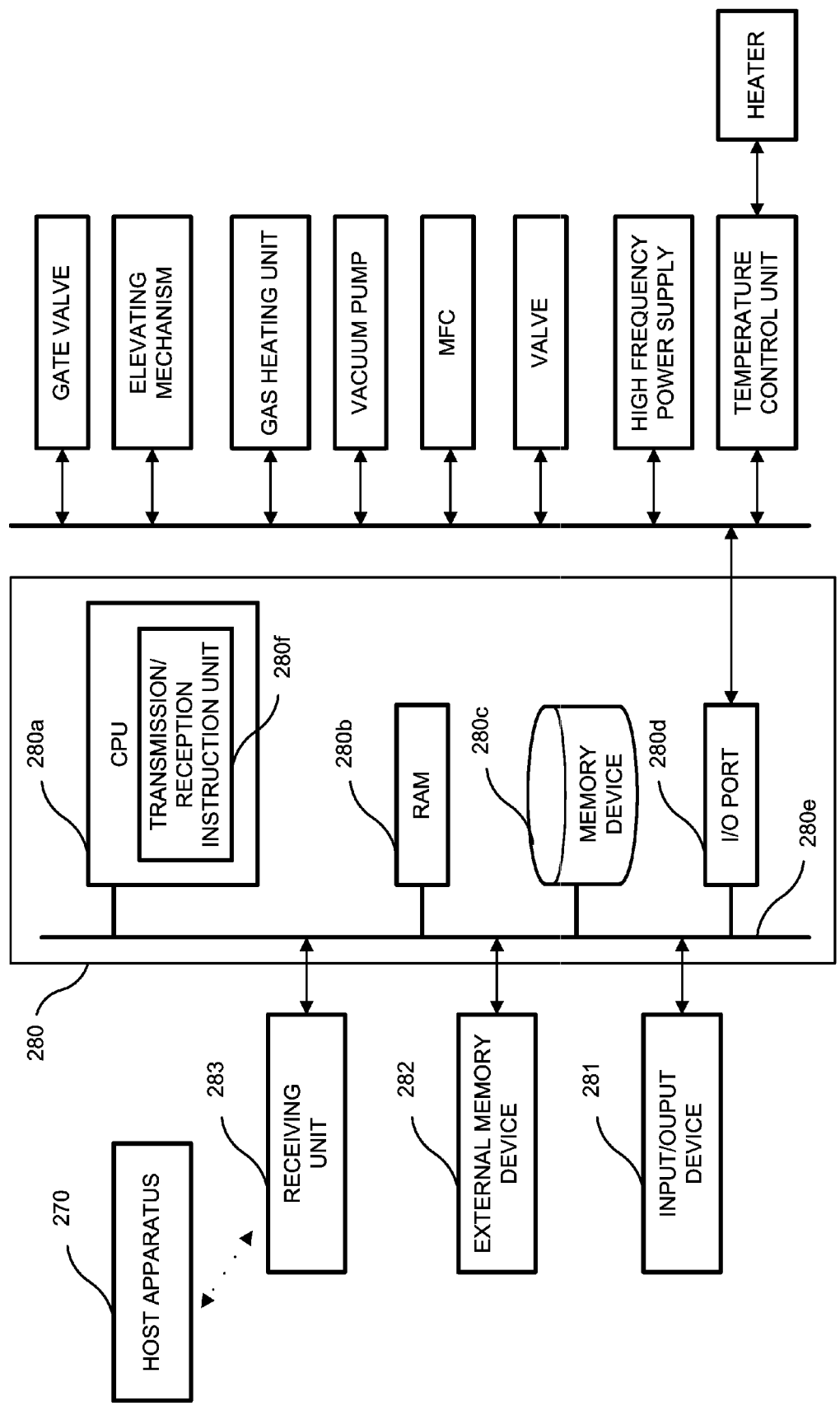
FIG. 6 schematically illustrates a configuration of a controller of the substrate processing apparatus and peripherals thereof according to the first embodiment.

FIG. 6 schematically illustrates the configuration of the controller 280. The controller 280, which is the control device (control means), may be embodied by a computer having a CPU (Central Processing Unit) 280a, a RAM (Random Access Memory) 280b, a memory device 280c and an I/O port 280d. The RAM 280b, the memory device 280c and the I/O port 280d may exchange data with the CPU 280a via an internal bus 280e. The transmission and the reception of data in the substrate processing apparatus 100 is performed according to an instruction of a transmission/reception instruction unit 280f, which is a part of the CPU 280a.

An input/output device 281 such as a touch panel and an external memory device 282 may be electrically connected to the controller 280. Also, a receiving unit 283 is installed which is connected to a host apparatus 270 through a network.

The memory device 280c may be embodied by components such as flash memory and HDD (Hard Disk Drive). A control program for controlling the operation of the substrate processing apparatus and a process recipe in which information such as the order and condition of the substrate processing is stored are readably stored in the memory device 280c. The process recipe is a program that is executed in the controller 280 to obtain a predetermined result by performing sequences of the substrate processing. Hereinafter, the process recipe and the control program are collectively referred to simply as a program. The term "program" may refer to only the process recipe, only the control program, or both. The RAM 280b is a work area in which the program or the data read by the CPU 280a are temporarily stored.

The I/O port 280d is electrically connected to the components of the substrate processing apparatus 100, such as the gate valve 1490, the elevating mechanism 218, the temperature control unit 215 and the gas heating unit 225.

The CPU 280a is configured to read and execute the control program stored in the memory device 280c, and read the process recipe in accordance with an instruction such as an operation command inputted from the input/output device 281. According to the contents of the process recipe, the CPU 280a may be configured to control operations such as opening and closing operations of the gate valve 1490, lifting operations of the elevating mechanism 218, ON/OFF operations of the pump 264, flow rate adjusting operations of the MFCS 115, 125, 135 and 224, operations of the valves 116, 126, 136 and 223. A plurality of process recipe may be provided for substrate processing. For example, a first recipe for forming a titanium oxide (TiO) film on the substrate 200 and a second recipe for forming a titanium nitride (TiN) film on the substrate 200 are provided. These recipes are read out upon receipt of an instruction to perform the substrate processing from the host apparatus 270.

The controller 280 may be embodied by installing the above-described program stored in an external memory device 282 into a computer, the external memory device 282 including a magnetic disk such as a hard disk, an optical disk such as DVD, a magneto-optical disk such as MO, and a semiconductor memory such as a USB memory. The method of providing the program to the computer is not limited to the external memory device 282. The program may be directly provided to the computer using a communication means such as a network (Internet or dedicated line) without the external memory device 282. The memory device 280c or the external memory device 282 may be embodied by a non-transitory computer readable recording medium. Hereafter, the memory device 280c and the external memory device 282 are collectively referred to as recording media. In this specification, "recording media" may indicate only the memory device 280c, indicate only the external memory device 282, and indicate both of the memory device 280c and the external memory device 282.

(2) Substrate Processing

Figure 7:
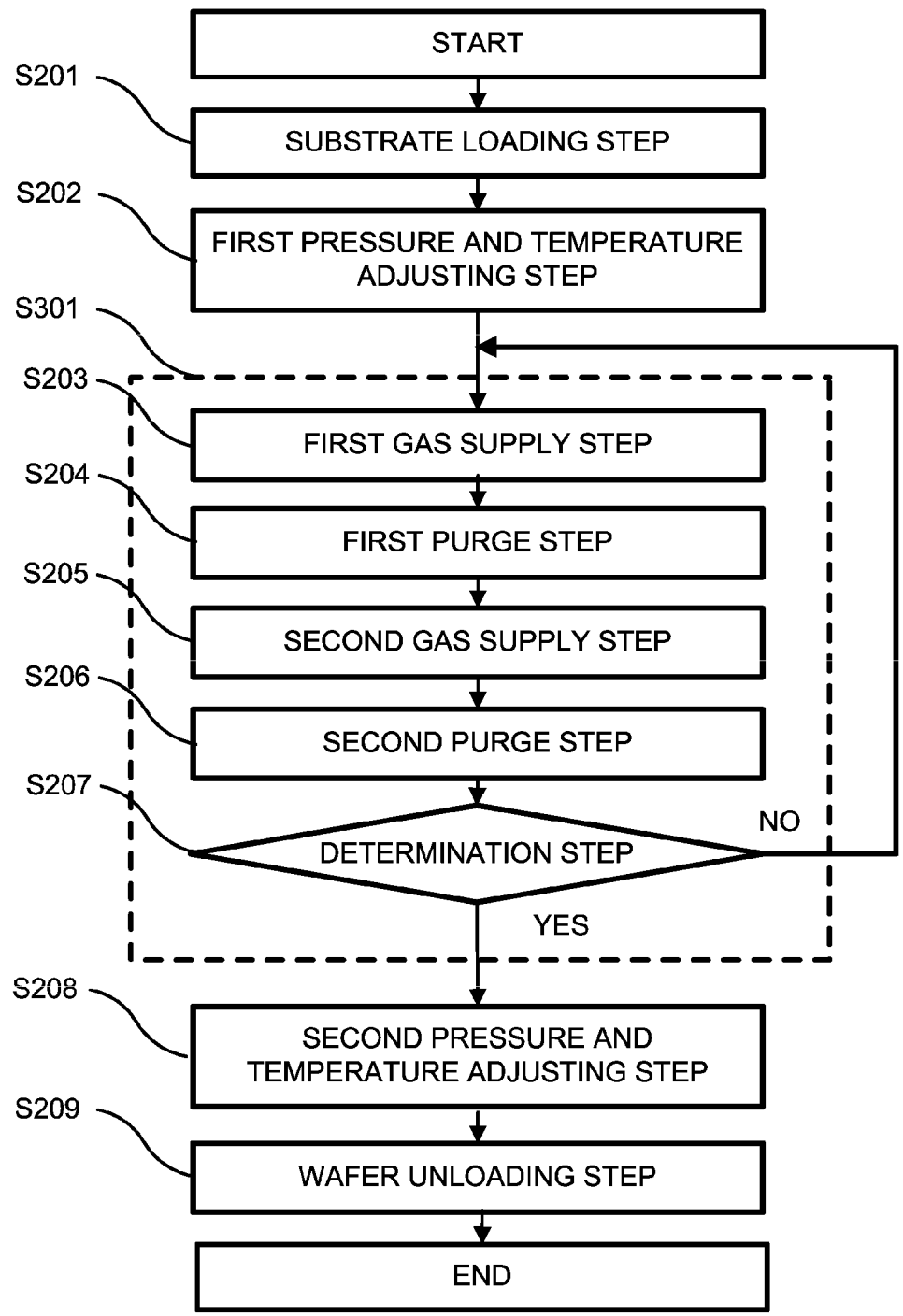
FIG. 7 is a flowchart illustrating a substrate processing according to the first embodiment.
Figure 8:
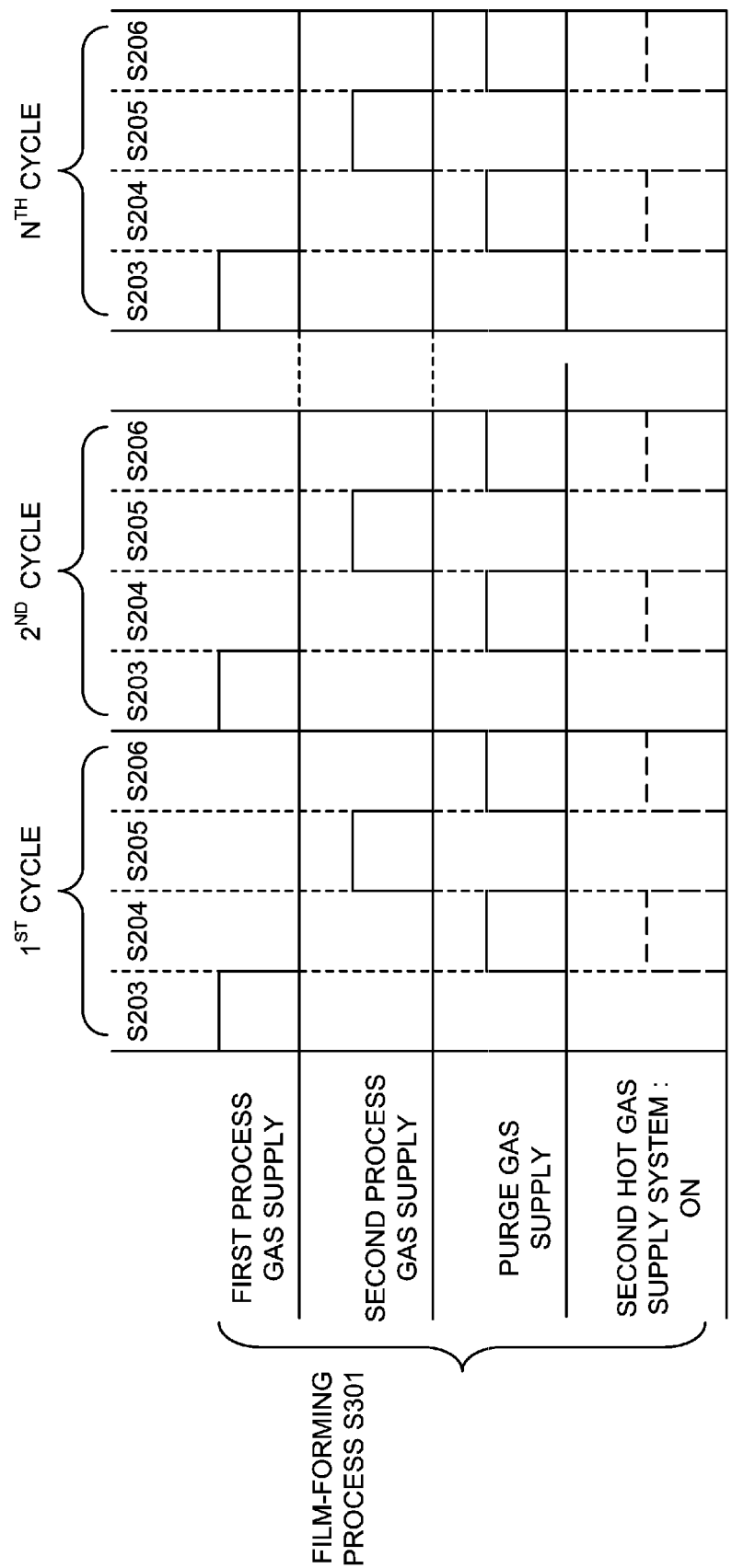
FIG. 8 is an exemplary sequence of supplying process gases in the substrate processing according to the first embodiment.
Figure 9:
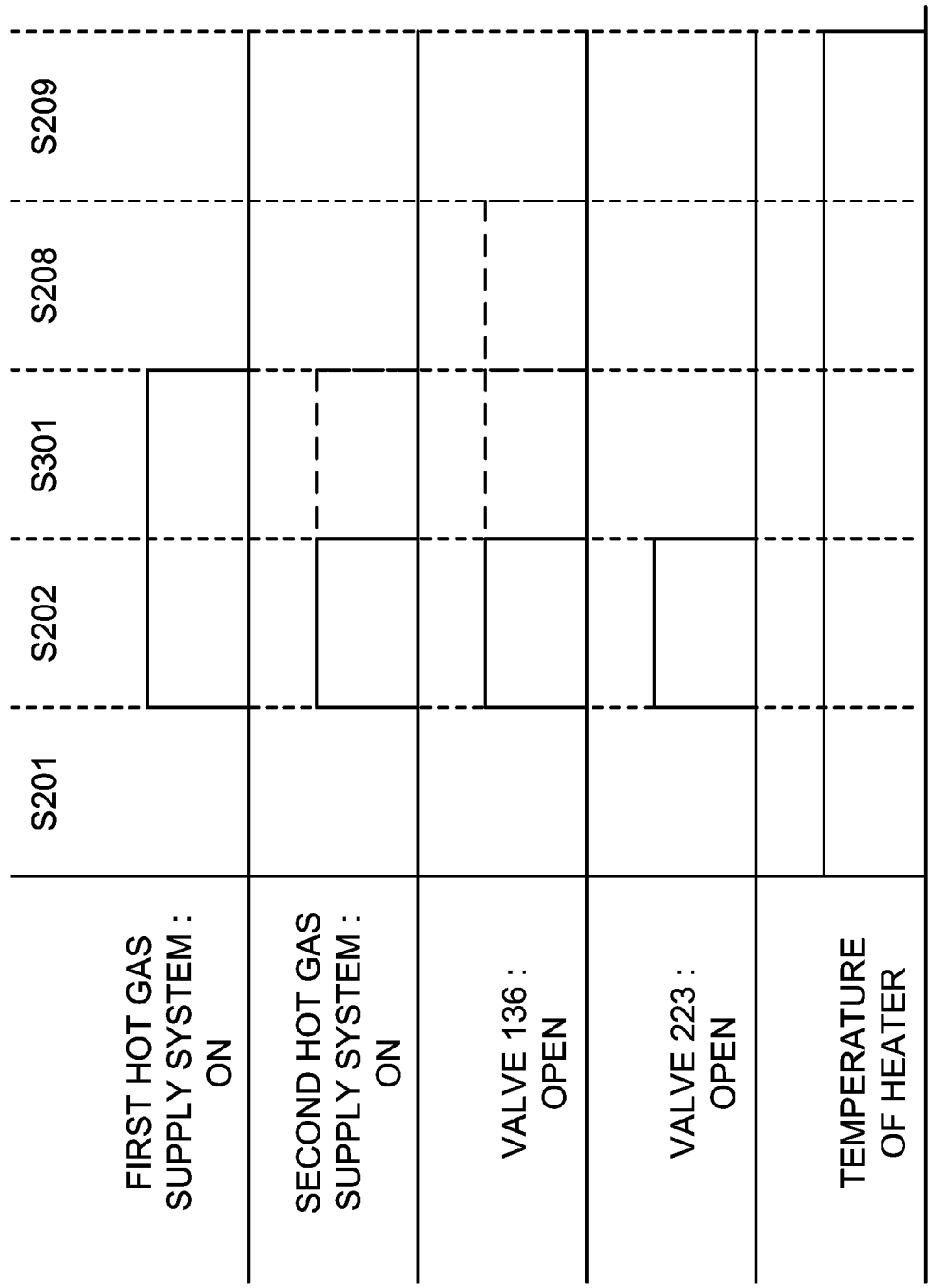
FIG. 9 is an exemplary sequence of supplying a hot gas in the substrate processing according to the first embodiment.

Hereinafter, a substrate processing for forming a film on the substrate 200 using the substrate processing apparatus 100 will be described with reference to FIG. 7. FIG. 7 is a flowchart illustrating the substrate processing according to the first embodiment.

The substrate processing will be described by way of an example wherein a titanium nitride film is formed on the pattern region 200b using $TiCl_4$ gas as the first element-containing gas and ammonia ($NH_3$) gas as the second element-containing gas. The titanium nitride film is used as a hard mask.

Substrate Loading Step S201

When the substrate processing is performed, the substrate 200 is loaded into the process chamber 201. Specifically, the substrate support unit 210 is lowered until the lift pins 207 penetrate the through-holes 214 in the substrate support unit 210. As a result, the lift pins 207 protrude a predetermined height from the surface of the substrate support unit 210. After the inner pressure of the process chamber 201 or the transfer chamber are adjusted to a predetermined pressure, the gate valve 1490 is opened and the substrate 200 is transferred through the gate valve 1490 and placed on the lift pins 207. After the substrate 200 is placed on the lift pins 207, the gate valve 1490 is closed and the substrate support unit 210 is elevated by the elevating mechanism 218 until the substrate 200 is transferred from the lift pins 207 to the substrate support unit 210 such that the back surface 200e is supported by the protruding portion 211a.

First Pressure and Temperature Adjusting Step S202

Next, the process chamber 201 is exhausted through the exhaust pipe 262 until the inner pressure of the process chamber 201 reaches a predetermined level (vacuum level). At this time, the opening degree of the valve body of the APC 266 is feedback-controlled based on the pressure measured by a pressure sensor (not shown). The energization state of the heater 213 is feedback-controlled based on the temperature detected by a temperature sensor (not shown) such that the internal temperature of the process chamber 201 reaches a desired temperature. Specifically, the substrate support unit 210 is pre-heated by the heater 213. After the process chamber 201 is exhausted, the first hot gas is supplied to the buffer structure 211 while the second hot gas is supplied to the process chamber 201 from the third gas supply system via the second hot gas supply system 226. The inner pressure of the process chamber 201 is adjusted to be higher than that of the space 211b or that of the transfer chamber 203 in order to suppress the displacement of the substrate 200. The inner pressure of the buffer space 211b is adjusted to be higher than the inner pressure of the transfer chamber 203 in order to prevent the lift pin 207 from floating. The first hot gas and the second hot gas are supplied for a predetermined time until the substrate 200 reaches a predetermined temperature. After the substrate 200 reaches the predetermined temperature or after the predetermined time elapses, the second hot gas supply system 226 stops the supply of the second hot gas.

Simultaneously, the inner pressure of the process chamber 201 or the inner pressure of the space 211b is adjusted to a pressure at which the first hot gas and the second hot gas are of viscous flow in order to improve the heat conduction effect by the gas.

Simultaneously, the temperature of the heater 213 is adjusted to range from 100° C. to 600° C., preferably from 100° C. to 500° C., and more preferably from 250° C. to 450° C. Each of the temperatures of the first hot gas and the second hot gas are adjusted to range from 100° C. to 800° C. By adjusting the temperatures of the heater 213, the first hot gas and the second hot gas, the temperature of the substrate 200 may be adjusted to range from room temperature to 500° C., preferably from room temperature to 400° C.

It is preferable that the temperature of the heater 213 is constant even when multiple substrates 200 are consecutively processed.

After the supply of the second hot gas by the second hot gas supply system 226 is stopped, the inner pressure of the process chamber 201 is adjusted to range from 50 Pa to 5,000 Pa. The first hot gas may be continuously supplied to the space 211b by the first hot gas supply system.

During the subsequent film-forming process S301, the inner pressure of the space 211b is adjusted to be lower than that of the process chamber 201.

Film-Forming Process S301

Next, a film-forming process S301 is performed. In the film-forming process S301, the first gas supply system and the second gas supply system are controlled to supply gases into the process chamber 201 according to the process recipe while the exhaust system is controlled to exhaust the process chamber 201 according to the process recipe. As a result, a hard mask is formed on the substrate 200, in particular in the pattern region 200b. The film-forming process S301 may include, for example, a CVD process for simultaneously supplying the first gas and the second gas into the process space and a cyclic process for alternately supplying the first gas and the second gas. Hereinafter, the cyclic process for alternately supplying the first gas and the second gas will be described with reference to FIGS. 7 through 9.

In the film-forming process S301, steps S203 through S207 are performed.

First Gas Supply Step S203

In the first gas supply step S203, $TiCl_4$ gas serving as the first gas (first process gas) is supplied into the process chamber 201 through the first gas supply system. Specifically, the flow rate of the $TiCl_4$ gas supplied from the first gas source 113 is adjusted by the MFC 115. After the flow rate of the $TiCl_4$ gas is adjusted, the $TiCl_4$ gas is supplied to the substrate processing apparatus 100. The $TiCl_4$ gas having the flow rate thereof adjusted is then supplied to the depressurized process chamber 201 through the buffer space 232 and the through-holes 234a of the dispersion plate 234. The exhaust system continuously exhausts the process chamber 201 such that the inner pressure of the process chamber 201 is maintained at a predetermined pressure. At this time, the $TiCl_4$ gas is supplied to the substrate 200 in the process chamber 201 at a predetermined pressure (first pressure) ranging from 10 Pa to 1,000 Pa, for example. By supplying the $TiCl_4$ gas to the substrate 200, a titanium-containing layer is formed on the substrate 200.

First Purge Step S204

After the titanium-containing layer is formed on the substrate 200, the gas valve 116 at the first gas supply pipe 113a is closed to stop the supply of the $TiCl_4$ gas. The first purge step S204 is performed by stopping the supply of the $TiCl_4$ gas and exhausting the first gas present in the process chamber 201 or the first process gas present in the buffer space 232 by the exhaust system.

In the first purge step S204, the remaining gas may be extruded by further supplying an inert gas from the third gas source 133 in addition to exhausting the remaining gas by the vacuum exhaust. In this case, the valve 136 is opened and the flow rate of the inert gas is adjusted by the WC 135. The vacuum exhaust may be combined with the supply of the inert gas. In the alternative, the vacuum exhaust and the supply of the inert gas may alternatively be performed.

The second hot gas supply system 226 may be turned on to generate the second hot gas. By using the second hot gas as the purge gas, the efficiency of removing the by-products present on the substrate 200 is improved. The temperature at the surface of the substrate 200 may be elevated to a predetermined temperature by supplying the second hot gas even when the temperature at the surface of the substrate 200 is lowered by supplying the first process gas.

After a predetermined time elapses, the supply of the inert gas is stopped by closing the valve 136. When the inert gas is used as a dilution gas, the inert gas may be continuously supplied by maintaining the valve 136 in open state.

Second Gas Supply Step S205

After first purge step S204, $NH_3$ gas serving as the second gas (second process gas) is supplied into the process chamber 201 through the second gas supply system. Specifically, the valve 126 is opened to supply $NH_3$ gas into the process chamber 201 via the gas introduction port 231a, the buffer chamber 232 and the through-holes 234a. The second gas is also referred to as process gas for processing the substrate 200, or a reactive gas which reacts with the first gas, titanium-containing layer and the substrate 200. $NH_3$ gas may be activated by turning on the RPU 124 and supplied to the process chamber 201. Activated $NH_3$ gas improves the characteristics of the TiN film. The characteristics of the TiN film may include hardness, abrasion resistance and coverage of the TiN film according to the first embodiment.

At this time, the WC 125 adjusts the flow rate of the $NH_3$ gas to a predetermined value such that the flow rate of $NH_3$ gas ranges from 100 sccm to 10,000 sccm, for example.

When the $NH_3$ gas is supplied to the titanium-containing layer formed on the substrate 200, the titanium-containing layer is modified to a titanium nitride (TiN) layer. The titanium nitride layer having a predetermined thickness and a predetermined distribution is formed depending on the conditions such as the inner pressure of the process chamber 201, the flow rate of the $NH_3$ gas and the temperature of the substrate 200.

After a predetermined time elapses, the valve 126 is closed to stop the supply of $NH_3$ gas.

At this time, the temperature of the heater 213 is adjusted to be equal to that of the heater 213 when the first gas supplied to the substrate 200.

Second Purge Step S206

The second purge step S206 same as the first purge step S204 is performed. The second hot gas supply system 226 may be turned on to generate the second hot gas in the second purge step S206 similar to the first purge step S204. By using the second hot gas as the purge gas, the efficiency of removing the by-products present on the substrate 200 is improved. The temperature at the surface of the substrate 200 may be elevated to a predetermined temperature by supplying the second hot gas even when the temperature at the surface of the substrate 200 is lowered by supplying the first process gas. The amount of by-products remaining after the second gas supply step S205 is greater than that of by-products remaining after the first gas supply step S203. Therefore, it is preferable that at least one of the temperature, the flow rate and the pressure of the second hot gas supplied in the second purge step S206 is higher than those of the first purge step S204. By increasing at least one of the temperature, the flow rate and the pressure of the second hot gas supplied in the second purge step S206 to be higher than those of the first purge step S204, the efficiency of removing by-products are improved.

Determination Step S207

After the second purge step S206 is complete, the controller 280 determines whether the cycle including the step S203 through the step S206 is performed a predetermined number of times (n times). That is, the controller 280 determines whether a titanium nitride (TiN) film having a desired thickness is formed on the substrate 200. The titanium nitride film having the desired thickness may be formed by performing the cycle including the step S203 through the step S206 at least once. It is preferable that the cycle is performed multiple times until the titanium nitride film having the desired thickness is formed on the substrate 200.

When the controller 280 determines, in the determination step S207, that the cycle is not performed the predetermined number of times ("NO" in FIG. 7), the film-forming process S301 is repeated. When the controller 260 determines, in the determination step S207, that the cycle is performed the predetermined number of times ("YES" in FIG. 7), the film-forming process S301 is terminated. Then, a second pressure and temperature adjusting step S208 and a substrate unloading step S209 are performed.

Second Pressure and Temperature Adjusting Step S208

Next, the process chamber 201 is exhausted through the exhaust pipe 262 until the inner pressure of the process chamber 201 reaches a predetermined pressure. Simultaneously, the substrate 200 may be cooled until the temperature of the substrate 200 is suitable for transport. When the substrate 200 is cooled, the valve 136 is opened to supply unheated inert gas to the substrate 200 with the second hot gas supply system 226 turned off. By supplying unheated inert gas, the cooling efficiency of the substrate 200 may be improved. The inert gas may be supplied while the substrate 200 is placed on the lift pin 207 by lowering the substrate support 210. That is, the cooling efficiency is improved when the substrate 200 is supported by the lift pin 207 with a space between the substrate 200 and the substrate support 210 to suppress the conduction of heat from the substrate support 210 to the substrate 200. When the temperature of the substrate support 210 is changed, the time required to perform the second pressure and temperature adjusting step S208 increases, resulting in degradation of the manufacturing throughput. Therefore, in the second pressure and temperature adjusting step S208, it is preferable that the inert gas is not supplied to the buffer structure 211 by the first hot gas supply system in order to maintain the temperature of the substrate support 210 in preparation for processing a next substrate 200.

Substrate Unloading Step S210

In the substrate unloading step S206, the processed substrate 200 is unloaded from the process chamber 201 to the transfer module (not shown) in an order reverse to the order in the substrate loading step S201.

As described above, the substrate processing is performed.

Other Embodiments

While the technique is described in detail by way of the above-described embodiment, the above-described technique is not limited thereto. The above-described technique may be modified in various ways without departing from the gist thereof.

For example, according to the above-described embodiments, TiCl$_4$ gas is used as the first element-containing gas and NH$_3$ gas as the second element-containing gas in the film-forming process performed in the substrate processing apparatus, and TiN film is formed on the substrate 200 as the hard mask. However, the above-described technique is not limited thereto. The above-described technique may also be applied to a formation of a hard mask having etch selectivity to the substrate 200a. The hard mask having etch selectivity to the base substrate 200a may include a metal such as chromium and molybdenum, or an oxide or nitride thereof.

While the technique is exemplarily described by way of a formation of a hard mask, the above-described technique is not limited thereto. For example, the above-described technique may be applied to a heating process performed in a formation process of the L-template. The above-mentioned procedure may also be applied to a film-forming process for repairing defects in the L-template.

According to the technique described herein, the quality of a template may be improved.

What is claimed is:

1. A method of manufacturing a lithography template, comprising:
   (a) loading a substrate into a process chamber, the substrate having a pattern region and a non-contacting region at center and peripheral portions thereof, respectively;
   (b) placing the substrate on a substrate support having a protruding portion and a bottom portion such that a back surface of the substrate is supported only by the protruding portion in the non-contacting region of the substrate;
   (c) heating the substrate by supplying a first hot gas into a space defined by the protruding portion and the bottom portion while supplying a second hot gas into the process chamber; and
   (d) processing the substrate after performing (c) by supplying a process gas into the process chamber while supplying the first hot gas into the space.

2. The method of claim 1, wherein an inner pressure of the process chamber is higher than that of the space in (c).

3. The method of claim 2, wherein the process gas is supplied into the process chamber in (d) without supplying the second hot gas.

4. The method of claim 3, further comprising: (e) supplying an inert gas into the process chamber after performing (d) without supplying the first hot gas into the space.

5. The method of claim 4, wherein the inert gas is supplied into the process chamber with the substrate placed on lift pins in (e).

6. The method of claim 2, further comprising: (e) supplying an inert gas into the process chamber after performing (d) without supplying the first hot gas into the space.

7. The method of claim 6, wherein the inert gas is supplied into the process chamber with the substrate placed on lift pins in (e).

8. The method of claim 1, wherein the process gas is supplied into the process chamber in (d) without supplying the second hot gas.

9. The method of claim 8, further comprising: (e) supplying an inert gas into the process chamber after performing (d) without supplying the first hot gas into the space.

10. The method of claim 9, wherein the inert gas is supplied into the process chamber with the substrate placed on lift pins in (e).

11. The method of claim 1, further comprising: (e) supplying an inert gas into the process chamber after performing (d) without supplying the first hot gas into the space.

12. The method of claim 11, wherein the inert gas is supplied into the process chamber with the substrate placed on lift pins in (e).

13. The method of claim 1, wherein the first hot gas is generated by being heated outside the space, and the second hot gas is generated by being heated outside the process chamber.

14. The method of claim 1, wherein in (c), the second hot gas is supplied downward onto an upper surface of the substrate in the process chamber while the first hot gas is supplied into the space.

15. The method of claim 1, wherein an edge portion of the substrate is supported by a step member provided at an inner side of an upper end of the protruding portion.

16. The method of claim 1, wherein the space extends along a back surface of the center and peripheral portions of the substrate such that the first hot gas uniformly heats the substrate across the pattern region and the non-contacting region.

17. A method of manufacturing a lithography template, comprising:
- (a) loading a substrate into a process chamber, the substrate having a pattern region and a non-contacting region at center and peripheral portions thereof, respectively;
- (b) placing the substrate on a substrate support having a protruding portion and a bottom portion such that a back surface of the substrate is supported by the protruding portion along an outer edge of the substrate;
- (c) heating the substrate by supplying a first hot gas into a space defined by the protruding portion and the bottom portion while supplying a second hot gas into the process chamber, the space being bounded at its periphery by the protruding portion and extending continuously along a back surface of the center and peripheral portions of the substrate such that the first hot gas uniformly heats the substrate across the pattern region and the non-contacting region; and
- (d) processing the substrate after performing (c) by supplying a process gas into the process chamber while supplying the first hot gas into the space.

18. The method of claim 17, wherein in (c), the second hot gas is supplied downward onto an upper surface of the substrate in the process chamber while the first hot gas is supplied into the space.

19. The method of claim 17, wherein the second hot gas and the process gas are supplied into the process chamber through a common gas supply pipe.

20. The method of claim 17, wherein an edge portion of the substrate is supported by a step member provided at an inner side of an upper end of the protruding portion.

\* \* \* \* \*